(12) United States Patent
Suzuki et al.

(10) Patent No.: US 8,345,135 B2
(45) Date of Patent: Jan. 1, 2013

(54) SOLID-STATE IMAGE SENSING DEVICE CONTAINING ELECTRON MULTIPLICATION FUNCTION

(75) Inventors: Hisanori Suzuki, Hamamatsu (JP); Yasuhito Yoneta, Hamamatsu (JP); Shin-ichiro Takagi, Hamamatsu (JP); Kentaro Maeta, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 157 days.

(21) Appl. No.: 12/920,131

(22) PCT Filed: Jan. 27, 2010

(86) PCT No.: PCT/JP2010/051038
§ 371 (c)(1),
(2), (4) Date: Oct. 20, 2010

(87) PCT Pub. No.: WO2010/087367
PCT Pub. Date: Aug. 5, 2010

(65) Prior Publication Data
US 2011/0025897 A1 Feb. 3, 2011

(30) Foreign Application Priority Data
Jan. 30, 2009 (JP) .................. 2009-020929

(51) Int. Cl.
*H04N 3/14* (2006.01)
(52) U.S. Cl. .................. 348/302; 348/304; 348/306
(58) Field of Classification Search .......... None
See application file for complete search history.

(56) References Cited

U.S. PATENT DOCUMENTS

| | | | |
|---|---|---|---|
| 4,684,800 A | 8/1987 | Morse et al. | |
| 5,337,340 A | 8/1994 | Hynecek | |
| 6,278,142 B1 | 8/2001 | Hynecek | |
| 6,444,968 B1 | 9/2002 | Burt et al. | |
| 6,862,333 B2 | 3/2005 | Kashima et al. | |
| 7,190,400 B2 | 3/2007 | Hynecek | |
| 7,291,821 B2 | 11/2007 | Robbins | |
| 7,420,605 B2 | 9/2008 | Pool et al. | |
| 7,755,685 B2* | 7/2010 | Tower et al. ................ | 348/294 |
| 2002/0191093 A1* | 12/2002 | Hynecek ................ | 348/311 |
| 2003/0042400 A1* | 3/2003 | Hynecek ................ | 250/208.1 |

(Continued)

FOREIGN PATENT DOCUMENTS

| | | |
|---|---|---|
| EP | 0 866 501 | 9/1998 |
| EP | 1 152 469 | 11/2001 |
| EP | 1 755 167 | 2/2007 |

(Continued)

*Primary Examiner* — Lin Ye
*Assistant Examiner* — John H Morehead, III
(74) *Attorney, Agent, or Firm* — Drinker Biddle & Reath LLP

(57) ABSTRACT

A solid state imaging device with an electron multiplying function includes an imaging region VR formed of a plurality of vertical shift registers, a horizontal shift register HR that transfers electrons from the imaging region VR, a multiplication register EM that multiplies the electrons from the horizontal shift register HR, and an electron injecting electrode 11A provided at an end portion of a starting side of the imaging region VR in an electron transfer direction. A specific vertical shift register (channel CH1) into which the electrons are injected by the electron injecting electrode 11A is disposed in a thick part of a semiconductor substrate, and is set in such a way as to be blocked from incident light.

4 Claims, 19 Drawing Sheets

U.S. PATENT DOCUMENTS

| | | |
|---|---|---|
| 2005/0029553 A1 | 2/2005 | Hynecek |
| 2007/0041017 A1 | 2/2007 | Robbins et al. |
| 2007/0146521 A1 | 6/2007 | Robbins |
| 2008/0137801 A1 | 6/2008 | Hadfield |
| 2008/0192882 A1* | 8/2008 | Lazovsky ................... 377/60 |
| 2008/0230680 A1* | 9/2008 | Yatokoro .................. 250/207 |
| 2008/0259197 A1* | 10/2008 | Ito et al. ..................... 348/311 |
| 2009/0086055 A1* | 4/2009 | Tower et al. ............... 348/229.1 |

FOREIGN PATENT DOCUMENTS

| | | |
|---|---|---|
| JP | 8-241977 | 9/1996 |
| JP | 2002-325720 | 11/2002 |
| JP | 2002-369081 | 12/2002 |
| JP | 2003-9000 | 1/2003 |

\* cited by examiner

SOLID-STATE IMAGE SENSING DEVICE CONTAINING ELECTRON MULTIPLICATION FUNCTION

TECHNICAL FIELD

The present invention relates to a solid state imaging device with an electron multiplying function.

BACKGROUND ART

Solid state imaging devices that use multiplication registers are known in the art (for example, those disclosed in Patent Documents 1 and 2). In such solid state imaging devices, an electric charge read out from an imaging region is transferred to a multiplication register via a horizontal shift register. The multiplication register typically includes an insulation layer formed on a semiconductor layer, and a transfer electrode formed on the insulation layer. In the multiplication register, in a state that a certain electrode (DC electrode) is fixed by applying a direct current to it, when an electric potential of a next-stage transfer electrode (multiplication electrode) is greatly increased, electron multiplication takes place when an electric charge is transferred between these electrodes. In such a solid state imaging device with an electron multiplying function, a method of injecting a certain amount of electric charge at a position just before the multiplication register and monitoring an output has been proposed with an object to monitor a multiplication factor (Patent Documents 1 and 2).

CITATION LIST

Patent Literature

Patent Document 1: Japanese Patent Application Laid-open No. 2002-369081
Patent Document 2: Japanese Patent Application Laid-open No. 2003-9000

SUMMARY OF INVENTION

Technical Problem

Thus, in the configuration described above, the charge is injected into the horizontal register arranged before the multiplication register. However, because the horizontal register generally has a high transfer rate, it is not possible to control a timing of charge injection with precision. Consequently, it is not possible to perform a stable monitoring.

It is an object of the present invention to provide a solid state imaging device with an electron multiplying function that can perform a stable monitoring of the multiplication factor.

Solution to Problem

To solve the problems mentioned above, a solid state imaging device with an electron multiplying function according to the present invention includes an imaging region formed of a plurality of vertical shift registers, a horizontal shift register that transfers electrons from the imaging region, a multiplication register that multiplies the electrons from the horizontal shift register, and an electron injecting unit provided at an end portion of a starting side of the imaging region in an electron transfer direction, wherein a specific vertical shift register into which the electrons are injected by the electron injecting unit is blocked from incident light.

A transfer speed of the vertical shift register is generally slower than that of a horizontal shift register. Therefore, the electrons can be injected into this specific vertical shift register from the end portion of the starting side in the electron transfer direction at a correct timing. The electrons are transferred to the horizontal shift register via the vertical shift register, and therefrom to the multiplication register via a corner register, and are multiplied by the multiplication register. Because this specific vertical shift register is set in such a way as to be blocked from incident light, the electrons injected for monitoring reflect a multiplication factor of the multiplication register, and are output at a stable timing. Therefore, stable monitoring of the multiplication factor can be performed.

The solid state imaging device according to the present invention includes a semiconductor substrate that has a thin part surrounded by a thick part, and has the imaging region formed in the thin part. It is preferable that the specific vertical shift register be positioned in the thick part. In other words, the solid state imaging device is a back-surface illuminated solid state imaging device with the imaging region formed in the thin part and receives light on a back surface, which is devoid of any electrodes. Consequently, imaging can be performed with high sensitivity. Because the thick part absorbs significantly more incident light than the thin part, an image incident from the back surface is practically prevented from reaching a front surface of the thick part. Therefore, the specific vertical shift register into which the electrons are injected can be kept blocked from incident light.

It is preferable that the electron injecting unit has an input electrode that is electrically connected to the semiconductor substrate, and a gate electrode that controls a potential between the input electrode and the specific vertical shift register.

Because the timing of injection of the electrons into the vertical shift register can be controlled by adjusting the voltage applied to the gate electrode, the electrons can be injected at a correct timing. Consequently, a stable monitoring of the multiplication can be performed.

It is preferable that the multiplication register includes a first multiplication register that multiplies the electrons transferred from a first region of the imaging region, and a second multiplication register that multiplies the electrons transferred from a second region of the imaging region. Moreover, the electron injecting unit includes a first electron injecting unit provided at an end portion of a starting side of the first region in the electron transfer direction, and a second electron injecting unit provided at an end portion of a starting side of the second region in the electron transfer direction.

Because electric charges generated in the first region and the second region are multiplied and are read out by different multiplication registers, signals can be read out in a shorter time. The multiplication factors of the first multiplication register and the second multiplication register can be monitored by causing the first multiplication register and the second multiplication register, respectively, to multiply the electrons injected from the first electron input unit and the second electron input unit disposed in the respective regions. In a structure that allows signal readout in a shorter time, the free space near the multiplication register tends to be narrower, posing a physical constraint on placement of the other elements. However, in the present invention, the electrons are injected not near the multiplication registers but from an end portion of the imaging region. Consequently, there are no physical constraints on placement of the electron injecting units.

Advantageous Effects of Invention

A solid state imaging device with an electron multiplying function according to the present invention is advantageous in that it enables a stable monitoring of a multiplication factor.

DESCRIPTION OF EMBODIMENTS

Figure 1:
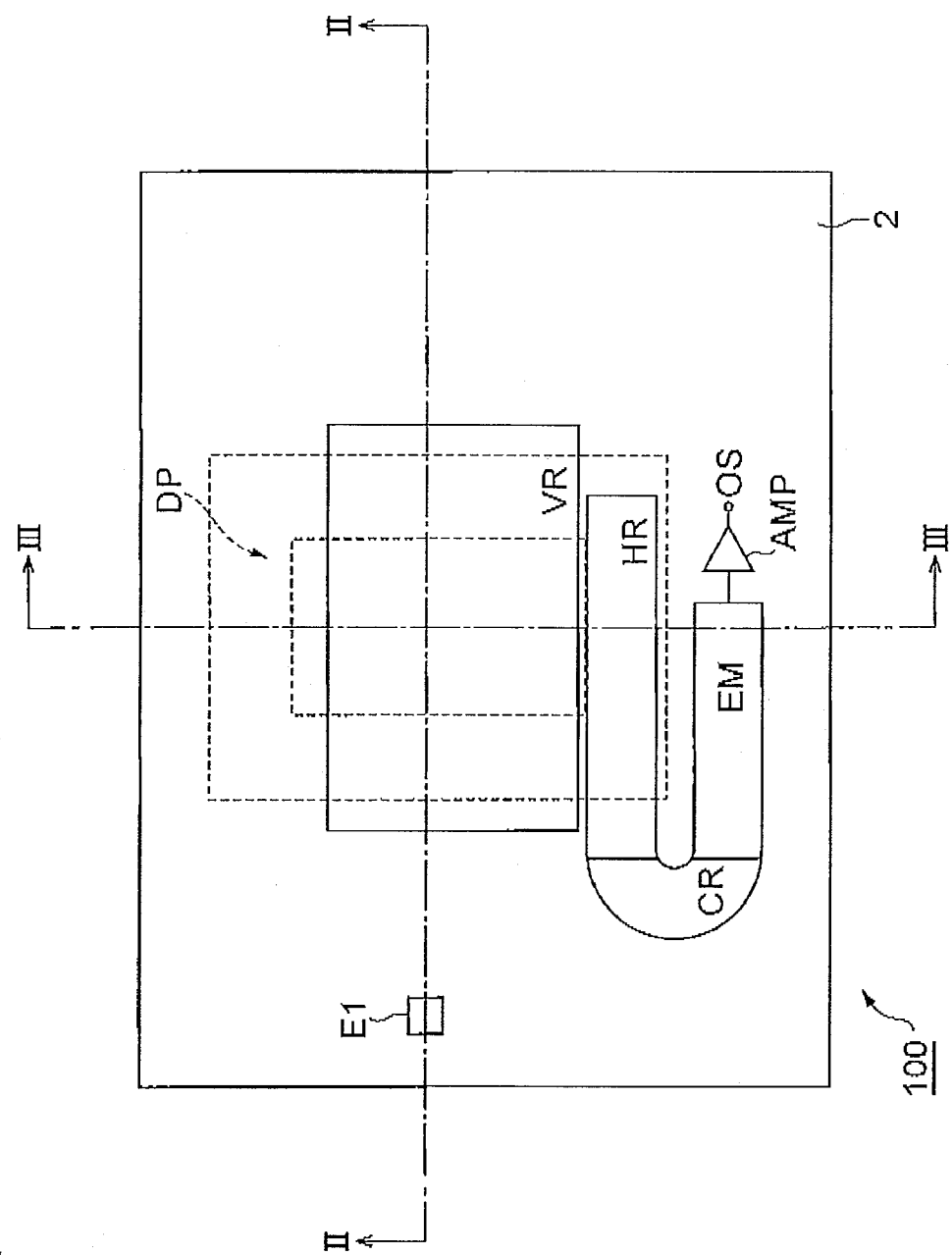
FIG. 1 is a plan view of a solid state imaging device.

Exemplary embodiments of a solid state imaging device with an electron multiplying function are explained below. Like reference numerals are used for like structural elements and overlapping explanation is omitted.

FIG. 1 is a plan view of a back-surface illuminated solid state imaging device 100.

An insulation layer 2 is formed on a semiconductor substrate, and a plurality of vertical electric charge transfer electrodes is formed on the surface of the insulation layer 2. These transfer electrodes form a vertical shift register. The region in which the vertical register is formed is an imaging region YR. In the present embodiment, the imaging region VR is a CCD imaging region. It is permissible to form the imaging region VR with a MOS imaging sensor.

A horizontal shift register HR is arranged along one side of the imaging region VR. A corner register CR is arranged in an electric charge transfer path between the horizontal shift register HR and a multiplication register EM. The structure of the corner register CR is the same as that of the horizontal shift register HR except that its electric charge transfer direction is bent into an arc-shape. An amplifier AMP is electrically connected to an output end of the multiplication register EM. An image signal obtained at an output end OS of the amplifier AMP is read sequentially pixel by pixel.

A backside of the semiconductor substrate 2 on which the insulation layer 2 is formed is etched in a rectangular shape to form a recessed portion DP. The side on which the recessed portion DP is formed is the backside of the substrate, and an image is incident on a backside of the solid state imaging device.

The semiconductor substrate in the region that corresponds to the bottom of the recessed portion is thinner than in the surrounding region and forms a thin part. The region surrounding the thin part is thicker and forms a thick part. A major portion of the imaging region VR formed of a plurality of the vertical shift registers is formed in the thin part. When a direction that is perpendicular to an electron transfer direction (from the imaging region YR towards the horizontal shift register HR) and a direction of substrate thickness is taken as a width direction of the imaging region VR, the width of the imaging region is greater than a width of the recessed portion DP, and the two ends of the imaging region VR in the width direction lie on the thick part. A specific vertical shift register into which the electrons will be injected, as explained at a later stage, lies on the thick part, and is blocked from incident light.

Figure 2:
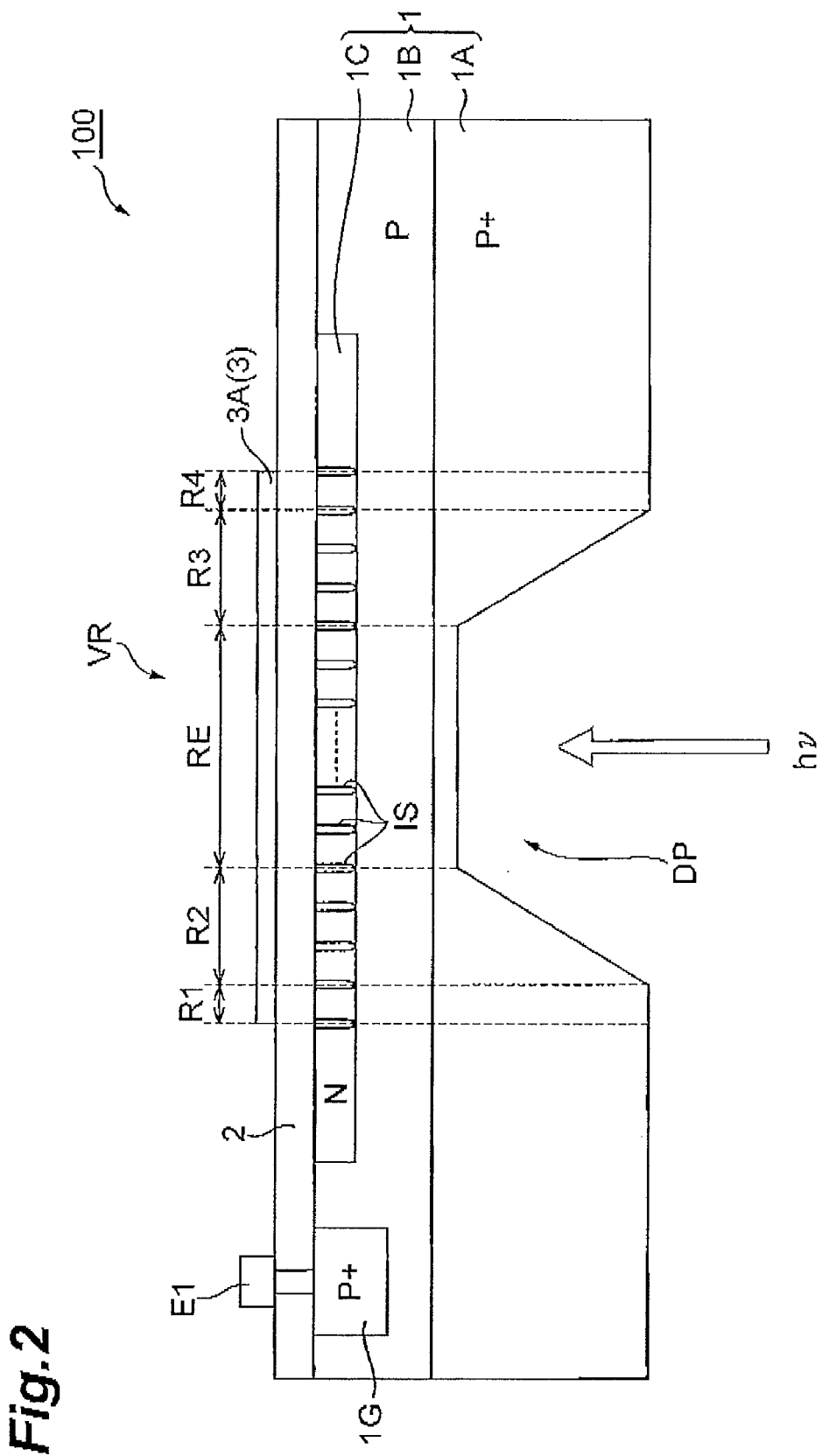
FIG. 2 is a sectional view of the solid state imaging device shown in FIG. 1 along arrows II-II.

FIG. 2 is a sectional view of the solid state imaging device shown in FIG. 1 along arrows II-II.

The solid state imaging device 100 includes a P-type semiconductor substrate 1A, a P-type epitaxial layer 1B grown on the semiconductor substrate 1A, the imaging region VR grown within the epitaxial layer 1B, and an N-type semiconductor region 1C grown within the epitaxial layer 1B. Thus, the solid state imaging device 100 has a structure of an embedded channel-type CCD. An optical image hv is incident from the backside of the substrate. The semiconductor substrate 1A is etched from the backside to form the recessed portion DP. An entire structure including all of the semiconductor substrate 1A, the epitaxial layer 1B, and the semiconductor region 1C is taken as the semiconductor substrate 1. The insulation layer 2 is formed on the semiconductor substrate 1, and transfer electrodes 3 are arranged on the insulation layer 2. A P-type contact region 1G is formed within a portion of the epitaxial layer 1B, and an electrode E1 is arranged within the contact region 1G. Electric potentials of the P-type semiconductor substrate 1A and the epitaxial layer 1B are determined when a reference electric potential such as a ground electric potential is applied to the electrode E1.

Electrons are transferred in the imaging region VR in a direction normal to a plan of the paper on which FIG. 2 is printed. Isolations (channel stops) IS, constituting a plurality of P-type semiconductor regions that extend in an electric charge transfer direction, are formed within the N-type semiconductor region. These isolations form channels of the vertical shift register.

Figure 19:
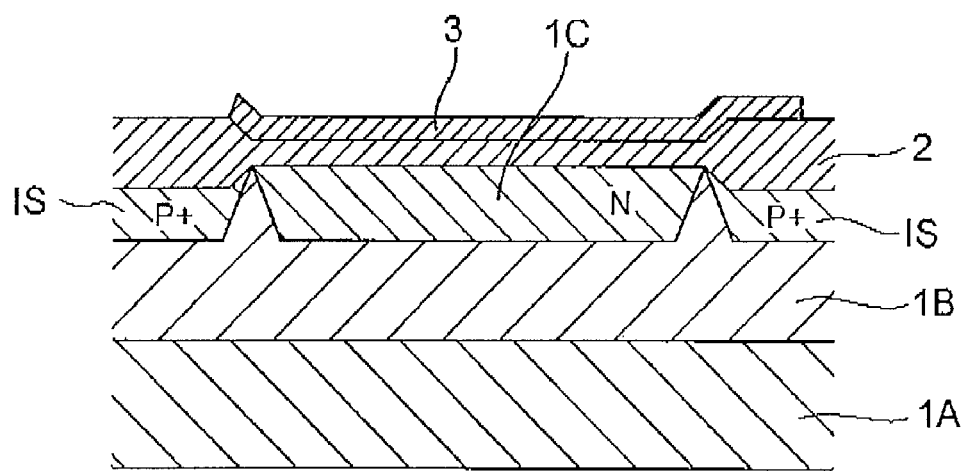
FIG. 19 is a magnified view of channel stops IS in the solid state imaging device shown in FIG. 1.

In FIG. 2, each isolation IS is shown to extend from the surface of the N-type semiconductor region 1C in a depth direction until it reaches the P-type epitaxial layer 1B. However, in actuality, as shown in FIG. 19, each isolation IS is formed in a scattered manner below a thicker portion of the insulation layer 2. Regions (including those with oblique faces) outside the bottom of the recessed portion DP is thicker. Dummy channels D2 to D4 and D5 to D7 are, respectively, formed in these regions R2 and R3 (see FIG. 8). Moreover, a monitoring channel D1 (and/or D8) is formed in a region R1 (and/or R4). Because the regions R1, R2, R3, and R4 where these channels are formed are thicker, the channels D2 to D4, D5 to D7, D1 and D8 are blocked from the light hv incident from the back surface of the substrate.

Figure 3:
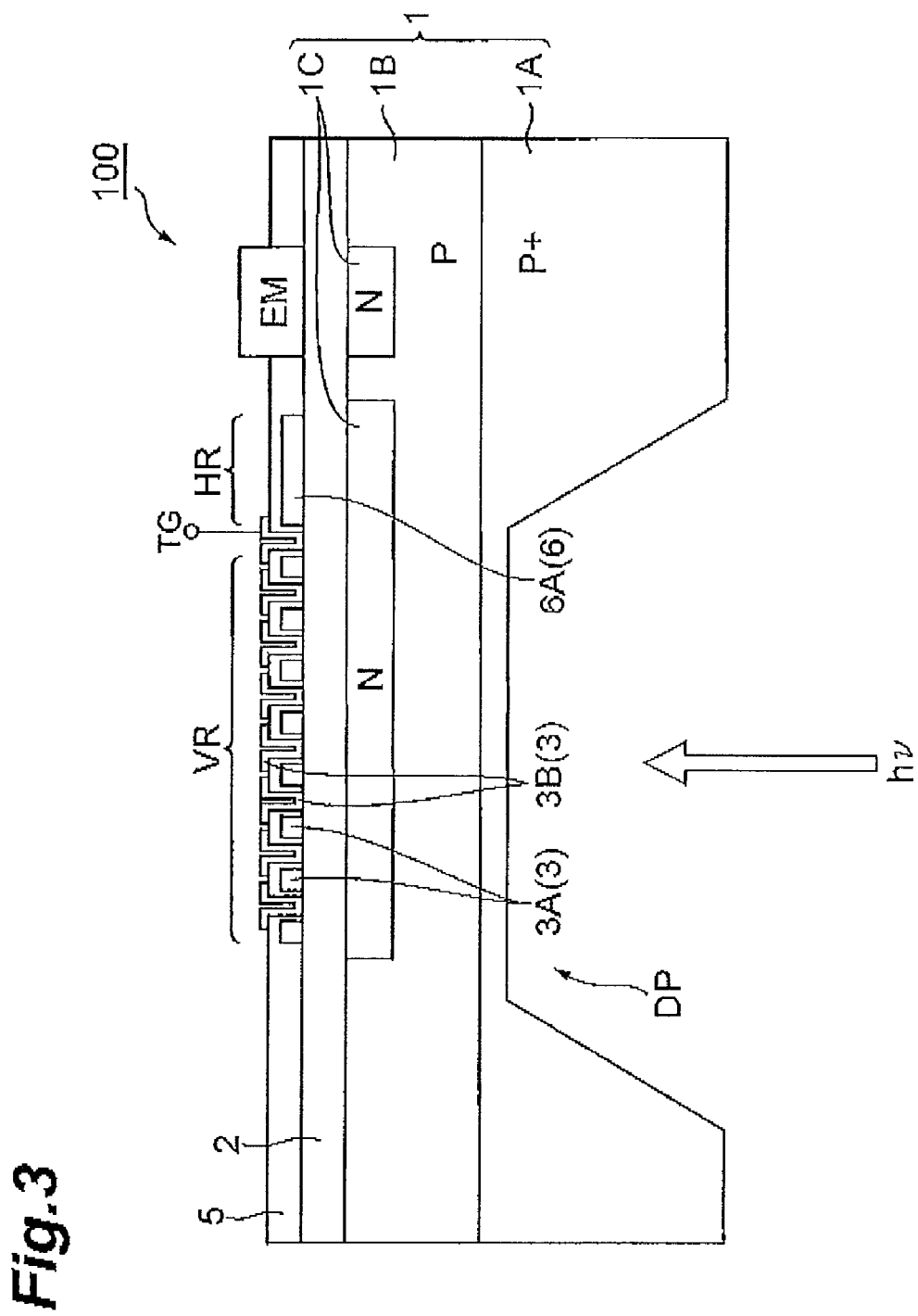
FIG. 3 is a sectional view of the solid state imaging device shown in FIG. 1 along arrows III-III.

FIG. 3 is a sectional view of the solid state imaging device shown in FIG. 1 along arrows III-III.

Transfer electrodes 3A and 3B formed in the imaging region VR are arranged in an alternating manner. Although a portion of these transfer electrodes 3A and 3B is overlapping, an insulation layer 5 is arranged between the adjacent transfer electrodes 3A and 3B. Thus, the transfer electrodes 3A and 3B are electrically separated from each other. A signal output from the imaging region VR is transferred to the multiplication register EM by the horizontal shift registers HR via the corner register CR. Moreover, the multiplication register EM is positioned adjacent to the horizontal shift register HR (only an electrode group is schematically shown as the EM in this diagram).

The semiconductor substrate 1 has a thin part where the recessed portion DP is formed and a thick part around the thin part. Carriers generated in the thick part because of incident light annihilate before they reach the surface. Particularly, because a P-type impurity concentration in the semiconductor substrate 1 is substantially higher than a P-type impurity concentration in the epitaxial layer 1B, traveling distances of the carriers are also shorter. Each of the horizontal shift register HR, the corner register CR (see FIG. 1), and the multiplication register EM are formed at least in a region that is outside of the thin part, and they are preferably formed in the thick part. Therefore, the carriers generated in the thick part do not mix inside these registers.

Figure 4:
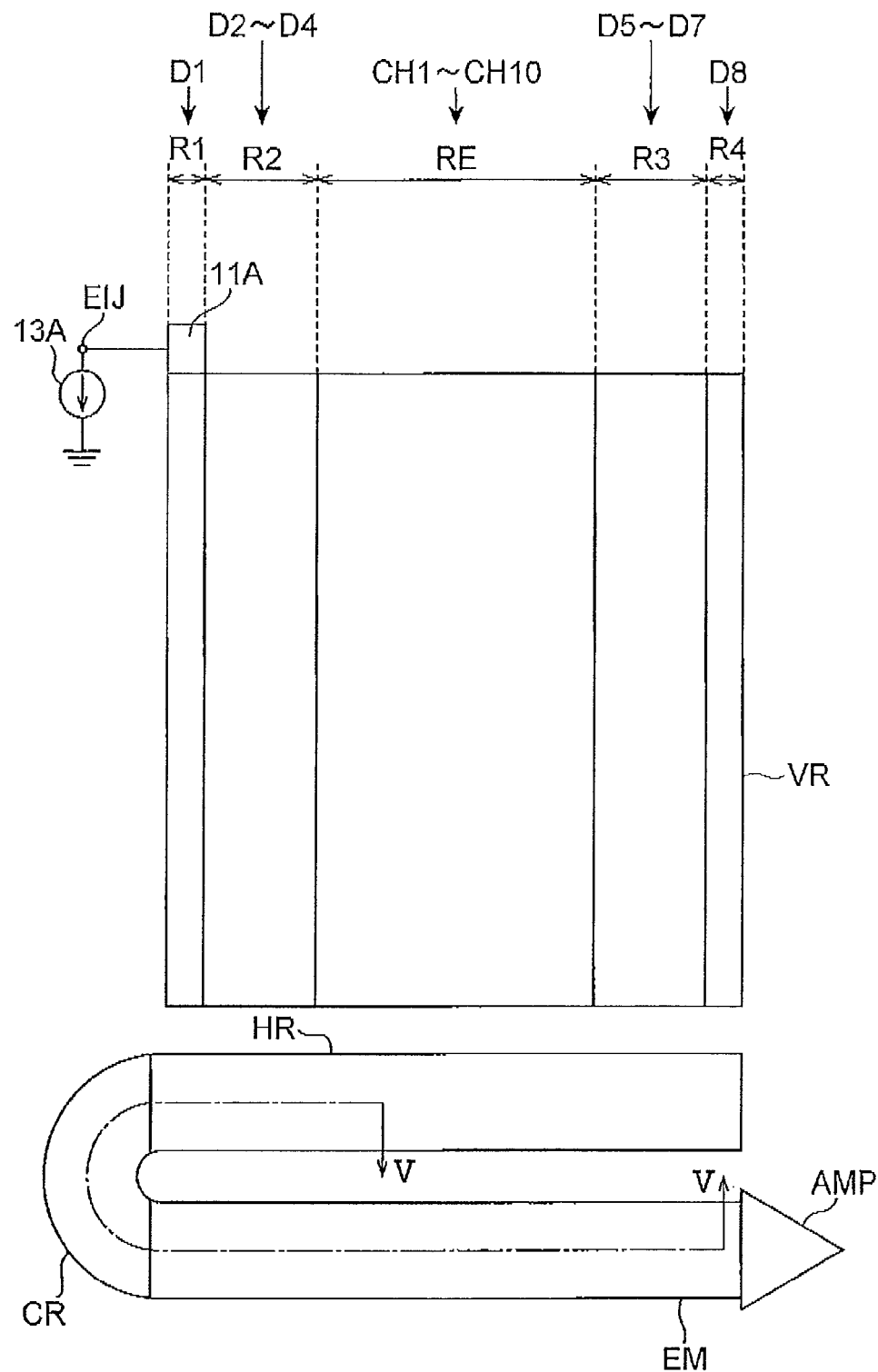
FIG. 4 is a plan view illustrating a detailed connection relation of the solid state imaging device.
Figure 5:
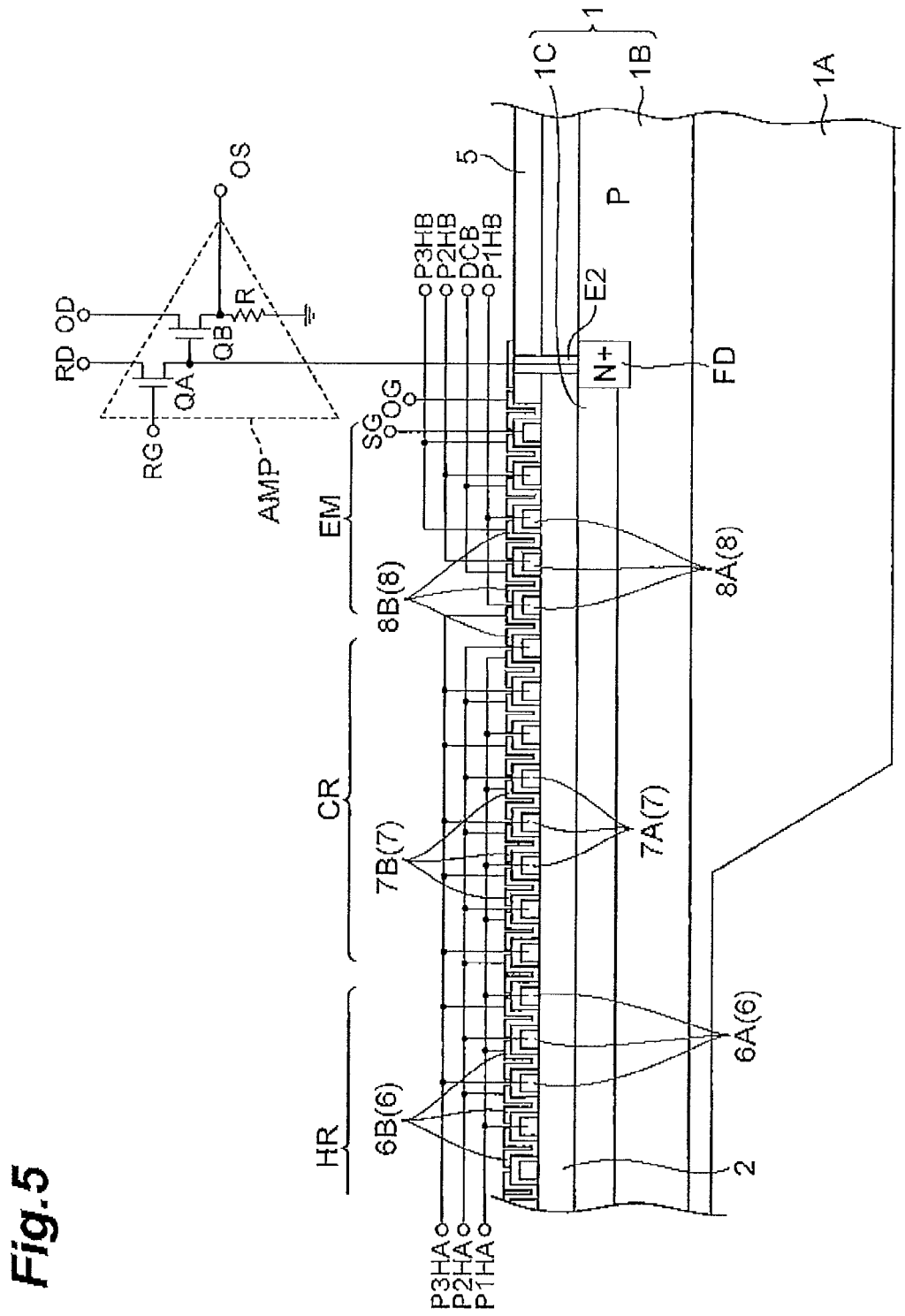
FIG. 5 is a sectional view of the solid state imaging device shown in FIG. 4 along arrows V-V.
Figure 6:
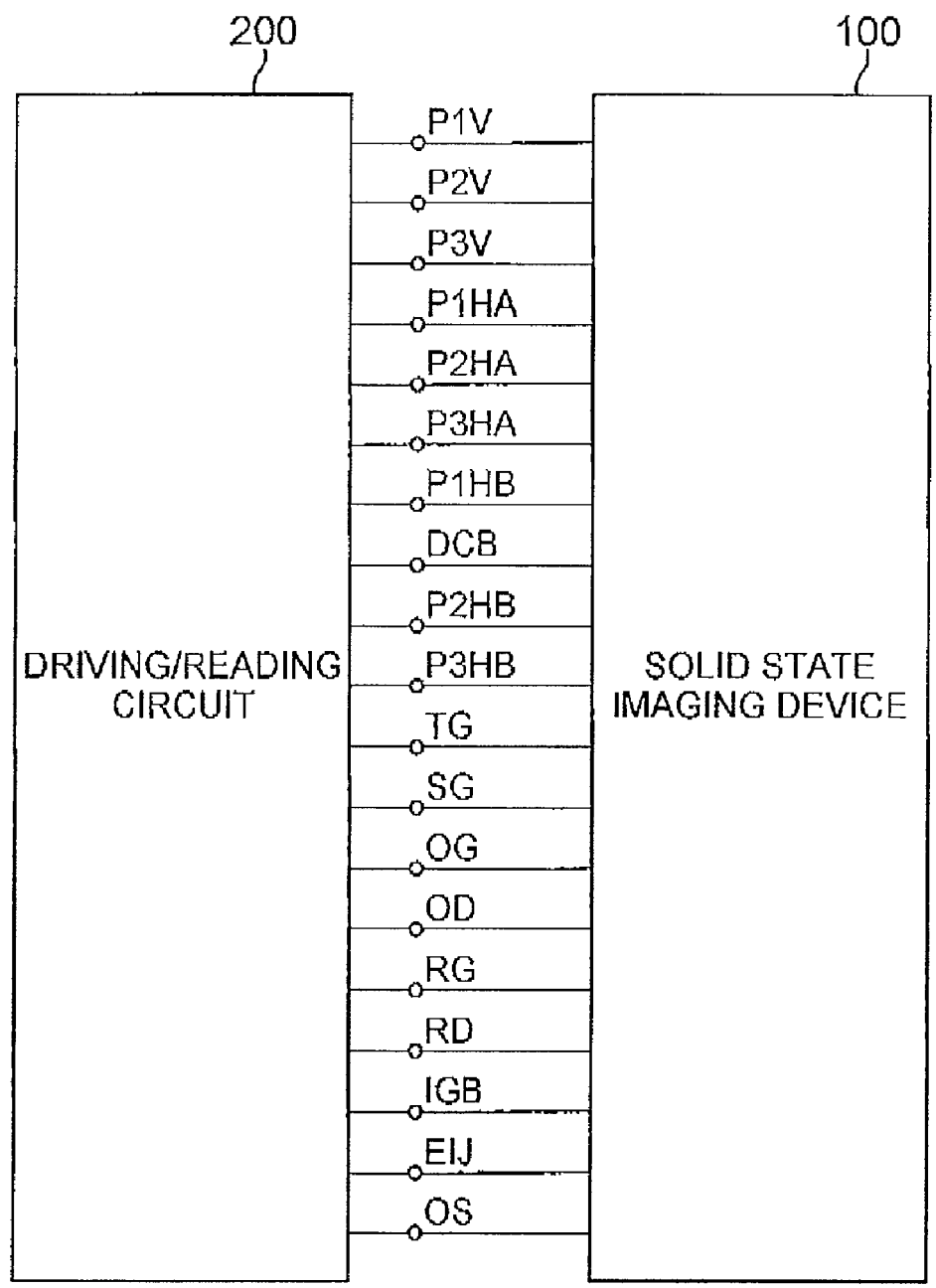
FIG. 6 is a block diagram illustrating a connection relation between a driving/reading circuit and the solid state imaging device.

FIG. 4 is a plan view illustrating a detailed connection relation of the solid state imaging device. FIG. 5 is a sectional view of the solid state imaging device shown in FIG. 4 along arrows V-V. FIG. 6 is a block diagram illustrating a connection relation between a driving/readout circuit 200 and the solid state imaging device 100.

The imaging region VR includes the vertical transfer electrodes 3A and 3B that are arranged alternately in a vertical direction (see FIG. 3). Each of the transfer electrodes 3A and 3B extends in a horizontal direction, and adjacent transfer electrodes 3A and 3B have a slight overlap. In the present embodiment, a 3-phase driving voltage (P1V, P2V, and P3V) is applied to the transfer electrodes 3. Electrons that accumulate right below the transfer electrodes 3 are transferred in the vertical direction because of the application of the driving voltage to the transfer electrodes 3. A CCD of an FFT (Full Frame Transfer) scheme is shown in this figure. However, this CCD can be replaced with a CCD of an FT (Frame Transfer) scheme that further includes an accumulation region, or with a CCD of an IT (Interline Transfer) scheme.

The P-type isolations IS (see FIG. 2) for separating each of vertical electric charge transfer channels CH1 to CH10 (see FIG. 8) are formed in the imaging region VR. An electric charge generated in response to incidence of light in the channels CH1 to CH10 that constitute the imaging region VR is transferred in the vertical direction. The electric charge of each channel flows right below each of transfer electrodes 6 (see FIG. 5) of the horizontal shift register HR.

A transfer electrode (transfer gate) to which a gate voltage TG is applied is provided between the imaging region VR and the horizontal shift register HR (see FIG. 3). An amount of electric charge that can flow in the horizontal shift register HR from the imaging region VR can be controlled by controlling the gate voltage TG.

Transfer electrodes 6A and 6B that constitute the horizontal shift register HR (see FIG. 5) are arranged alternately in the horizontal direction. The transfer electrodes 6A and 6B have an overlapping portion. In any of the registers, the insulation layer 5 (see FIG. 5) that is formed on the insulation layer 2 is positioned between adjacent transfer electrodes 3A, 3B, 6A, 6B, 7A, 7B, 8A, and 8B. Thus, the adjacent transfer electrodes are electrically separated from each other. A 3-phase driving voltage (P1HA, P2HA, and P3HA) is applied to the transfer electrodes 6. Electrons right below the transfer electrodes 6 are transferred in the horizontal direction. The corner register CR, that is bent in an arc-shape continues with the horizontal shift register HR. The transfer electrodes 7A and 7B that constitute the corner register CR are arranged alternately along the arc. The transfer electrodes 7A and 7B have an overlapping portion. The 3-phase driving voltage (P1HA, P2HA, and P3HA), which is the same as the driving voltage applied to the horizontal shift register HR, is applied to the transfer electrodes 7. Electrons right below the transfer electrodes 7 are transferred along the arc to the multiplication register EM.

In the multiplication register EM, the transfer electrodes 8A and 8B are arranged alternately in the horizontal direction. The transfer electrodes 8A and 8B have an overlapping portion. A 3-phase driving voltage (P1HB, P2HB, and P3HB) is applied to the transfer electrodes 8. Electrons right below the transfer electrodes 8 are transferred in the horizontal direction. Among four sets of the transfer electrodes 8, the driving voltage is applied to three sets of the transfer electrodes 8, and a direct-current electric potential DCB is applied to the remaining one set of the transfer electrodes 8 that are DC electrodes. In the present embodiment, when there are four sets of the transfer electrodes 8 that are arranged adjacent to each other in the horizontal direction, that is, when there are a first, second, third, and fourth sets of the transfer electrodes 8, the set that is positioned second is taken as the DC electrodes and the direct-current electric potential DCB is applied to this.

A positive electric potential is applied to the transfer electrodes 8. An appropriate positive electric potential (P1HB) is applied to the first set of the transfer electrodes 8 thereby making a potential well deep (increase the electric potential: see FIG. 7) to accumulate electrons in this well. A high positive electric potential (a maximum value of P2HB>a maximum value of P2HA) is applied to the third set of the transfer electrodes 8 thereby making a potential well deep. A certain electric potential (DCB) applied to the second set of the transfer electrodes 8 is lower than these electric potentials (P1HB and P2HB). Thus, a potential barrier is formed between the first set and the third set of the transfer electrodes 8. In this state, when the potential well of the first set of the transfer electrodes 8 is made shallower (decrease electric potential: see FIG. 7), electrons overflow from this potential well, cross the barrier, and fall in the potential well (depth of potential well=$\Phi A$) of the third set of the transfer electrodes 8. Electron multiplication is performed when the electrons fall. Subsequently, the potential of the first set of the transfer electrodes 8 is further decreased (upward direction) so that the accumulated electrons are completely transferred to the potential well of the third set of the transfer electrodes 8. The direction of the potential $\Phi$ is positive downward.

Then, by making the potential well right below the fourth set of the transfer electrodes 8 deeper and the potential well right below the third set of the transfer electrodes 8 shallower, the multiplied electrons can be moved in the potential well of the fourth set of the transfer electrodes 8. Similarly, by employing the same method that is used to perform the electric charge transfer from the third set of the transfer electrodes 8 to the fourth set of the transfer electrodes 8, the electrons that have accumulated in the potential well of the fourth set of the transfer electrodes 8 can be moved to the next set of the transfer electrodes 8, i.e., the first set of the transfer electrodes 8, and accumulated there. Thereafter, multiplication and transfer steps are repeated for the next set in the same manner as described above. Although a 3-phase driving is used in the present embodiment to perform electric charge transfer, it is possible to use a 4-phase driving or a 2-phase driving.

The multiplied electrons finally flow in a high-density N-type semiconductor region FD. The N-type semiconductor region FD is connected to the amplifier AMP. The amplifier AMP is a floating diffusion amplifier formed within the semiconductor substrate 1.

Various signals are supplied from the driving/reading circuit 200 to the solid state imaging device 100. To make the explanation of an electric charge reading unit simple, identical symbols are used for structural elements and signals.

A configuration of a signal reading unit is explained first. The amplifier AMP is connected to the semiconductor region FD of the signal reading unit shown in FIG. 5. A gate electric potential of a transistor QB varies depending on an amount of electric charge in the semiconductor region FD, and in response to this, an amount of electric current flowing from an output drain OD through a resistor R via the transistor QB also varies. That is, a voltage OS (output voltage) between two terminals of the resistor R varies depending on the amount of electric charge accumulated in the semiconductor region FD, and this voltage OS is read.

A reset voltage RG is input to a reset gate RG after completion of reading of an electric charge from one pixel. Thus, the electric potential of the semiconductor region FD is reset via the reset drain RD. Because a potential of the reset drain RD is positive, in a reset operation, a potential well in which electrons can be accumulated is formed in the semiconductor region FD. After completion of the reset operation, the electric potential of the semiconductor region FD is set to a floating level by controlling the reset gate RG and turning off a transistor QA.

Before causing the electric charge to flow in the semiconductor region FD, an electric potential of a previous signal gate SG is increased to cause the electrons to accumulate there, and an electric potential of an output gate OG is fixed to form a barrier so that the electric charge does not flow from a region tight below the signal gate SG to the semiconductor region FD. Thereafter, in the state that the electric potential of the output gate OG is fixed, when the electric potential of the signal gate SG is decreased, the electric charge accumulated right below the signal gate SG flows to the semiconductor region FD.

The multiplication register EM is explained next. The multiplication register EM functions to multiply electrons from the horizontal shift register HR.

The epitaxial layer is known for its excellent crystalline property. Therefore, when the N-type semiconductor region 1C is formed within the P-type epitaxial layer 1B, electron transfer is performed with a high accuracy because the electrons in each of the vertical shift register, the horizontal shift register HR, and the corner register CR are transferred within a semiconductor having an excellent crystalline property. The electrons transferred in this manner enter the semiconductor region 1C of the multiplication register EM.

The multiplication register EM includes the N-type semiconductor region 1C, the insulation layer 2 formed on the semiconductor region 1C, a plurality of the transfer electrodes 8 formed adjacent to each other on the insulation layer 2, and the DC electrode 8 that is located between the transfer electrodes 8 and to which the direct current electric potential DCB (see FIGS. 4 and 7) is applied. The epitaxial layer 1B is formed on the entire substrate. On the other hand, the N-type semiconductor region 1C is selectively formed only in the region in which are formed the semiconductor region 1C, the imaging region VR, the horizontal shift register UK, the corner register CR, and the multiplication register EM.

Figure 7:
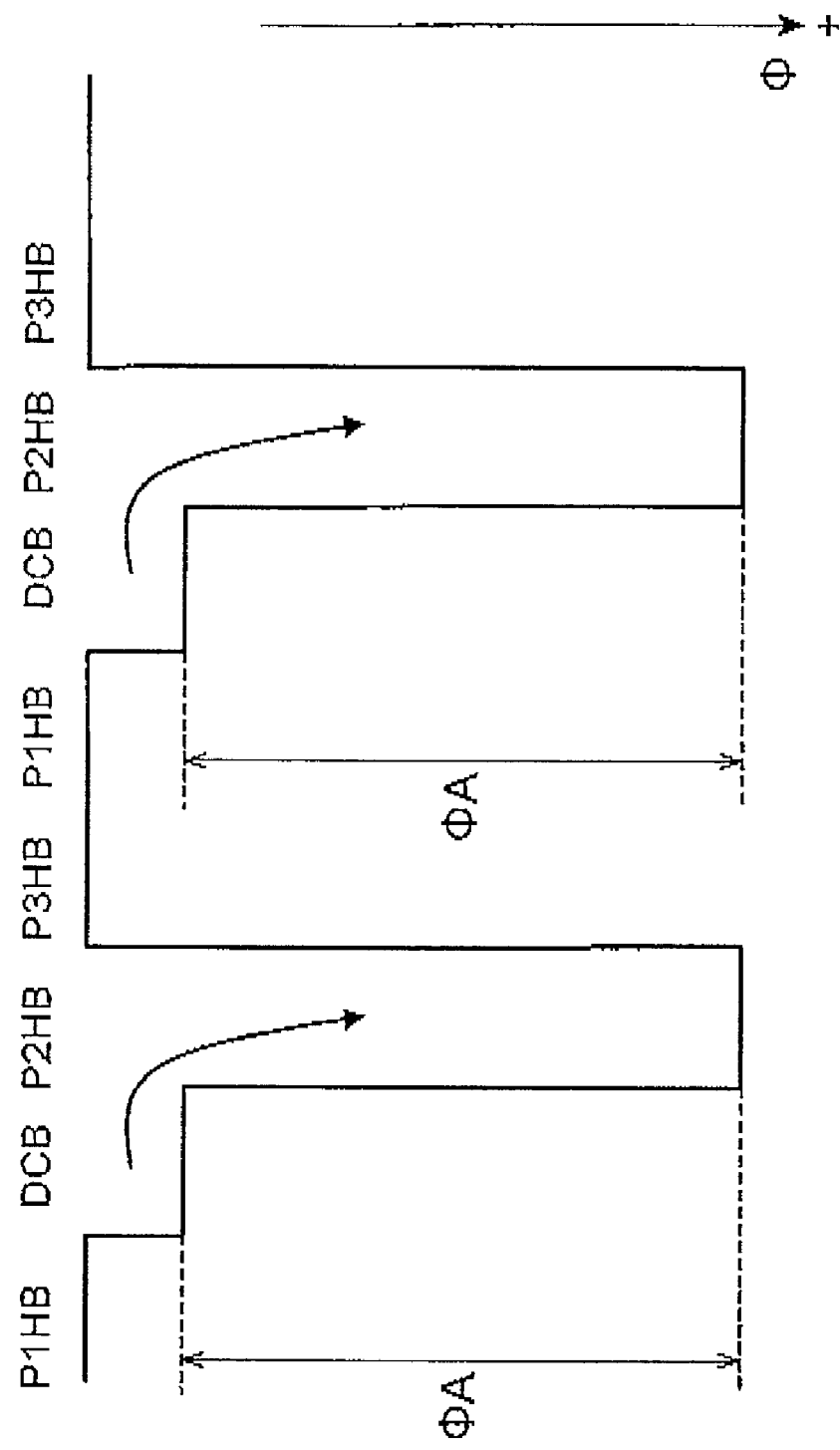
FIG. 7 is a potential diagram of a multiplication register.

FIG. 7 is a potential diagram of a multiplication register EM.

In the above structure, as shown in this figure, the degree of electron multiplication increases significantly because there takes place a precipitous electric potential change right below the transfer electrodes 8 of the multiplication register EM. In other words, because a precipitous electric potential change takes place in the N-type semiconductor region 1C between the DC electrodes 8 to which the direct-current electric potential DCB is applied and next-stage transfer electrodes (multiplication electrodes) 8 to which the electric potential P2HB is applied, excellent electron multiplication is performed.

Electron multiplication is performed when the electrons flow from the potential well (electric potential P1HB) of the first set of the transfer electrodes to the potential well (electric potential P2HB) of the third set of the transfer electrodes after crossing the potential well of the second set of the transfer electrodes to which the direct-current electric potential DCB is applied.

The material of the semiconductor is Si, and an impurity concentration $C_P$ of the P-type semiconductor layer and an impurity concentration $C_N$ of the N-type semiconductor layer are as follows: A surface resistance of the P-type epitaxial layer 1B is set higher than a photosensitivity of the imaging region VR.

P-type semiconductor substrate 1A: $C_P(1A)=1\times10^{17}$ to $1\times10^{19}/cm^3$ P-type epitaxial layer 1B: $C_P(1B)=1\times10^{11}$ to $1\times10^{16}/cm^3$ N-type semiconductor region 1C: $C_N(1C)=1\times10^{12}$ to $1\times10^{17}/cm^3$ An impurity concentration C satisfies the following relation:

$$C_P(1A) > C_N(1C) > C_P(1B)$$

A thickness t (1A) of the P-type semiconductor substrate 1A, a thickness t (1B) of the P-type epitaxial layer 1B, and a thickness t (1C) of the N-type semiconductor region 1C satisfy the following relation:

$$t(1A) > t(1B) > t(1C)$$

An electron injecting unit (input electrode) 11A shown in FIG. 4 is explained next.

The electron injecting unit (input electrode) 11A is disposed at an end portion of a starting side of the imaging region VR in the electron transfer direction. The transfer speed of the electrons of the vertical shift register is slower than that of the horizontal shift register. Therefore, the electrons can be injected into this specific vertical shift register (monitoring channel D1) from the end portion of the starting side in the electron transfer direction at a correct timing. The electrons are transferred to the horizontal shift register HR via the vertical shift register, and therefrom to the multiplication register EM via the corner register CR, and are multiplied by the multiplication register EM. Because this specific vertical register (channel D1) that is arranged at the end portion is set in such a way as to be blocked from incident light, the electrons injected for the purpose of monitoring correctly reflect the multiplication factor of the multiplication register, and are output at a stable timing. Therefore, stable monitoring of the multiplication factor can be performed.

This specific vertical shift register (channel D1) is disposed in the thick part. The solid state imaging device is a back-surface illuminated solid state imaging device with the imaging region VR formed in the thin part and receives light on the back surface. Consequently, imaging can be performed with high sensitivity. Because the thick part can absorb significantly more incident light than the thin part, the image incident from the back surface is practically prevented from reaching the front surface of the thick part. Therefore, the specific vertical shift register (channel D1) into which the electrons are injected can be kept blocked from incident light. The electrons are supplied to the input electrode 11A from a terminal EIJ of a current source 13A.

Figure 8:
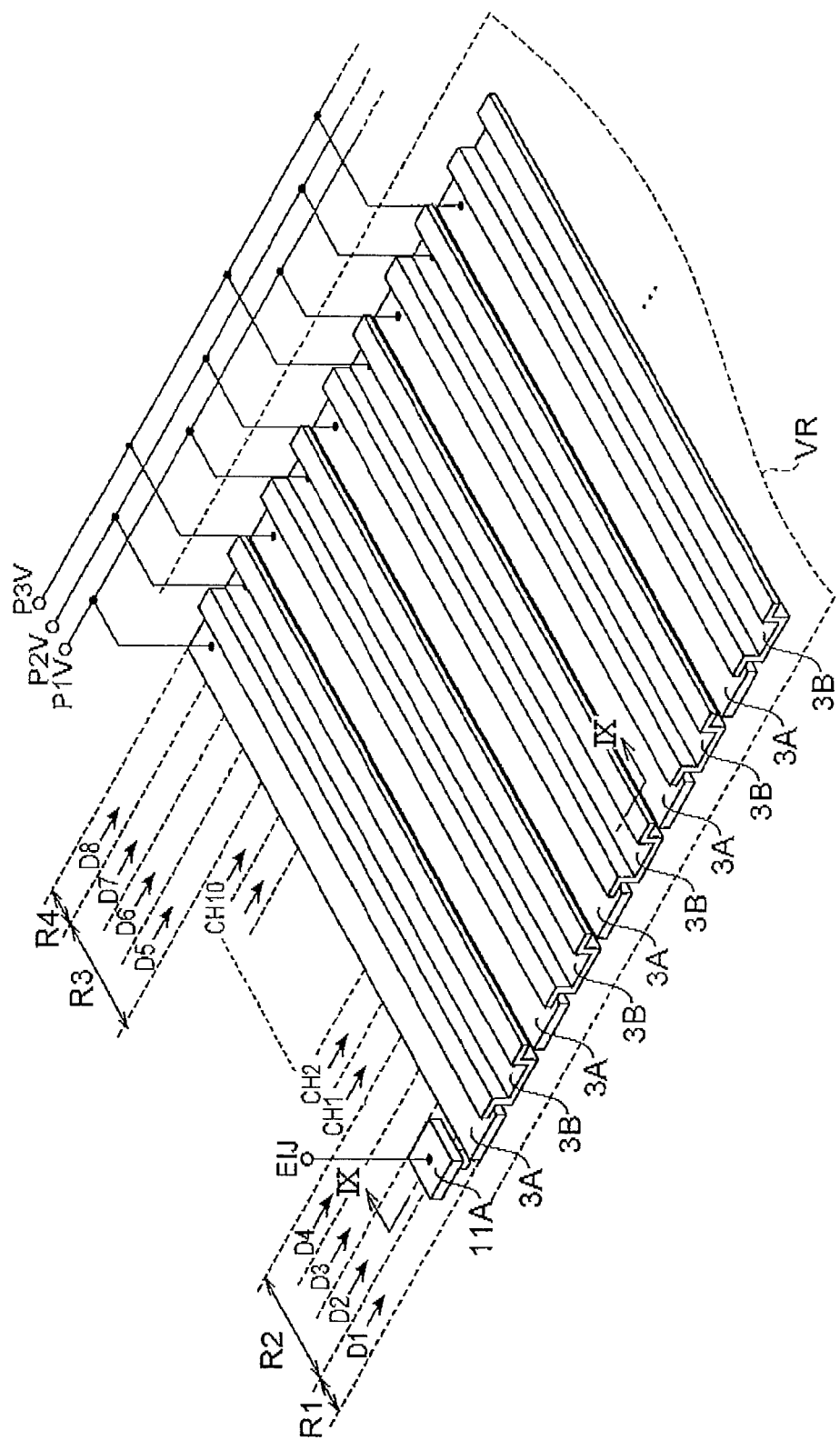
FIG. 8 is a perspective view of a portion of a starting side of the imaging region VR in an electron transfer direction in a solid state imaging device according to a first embodiment.
Figure 9:
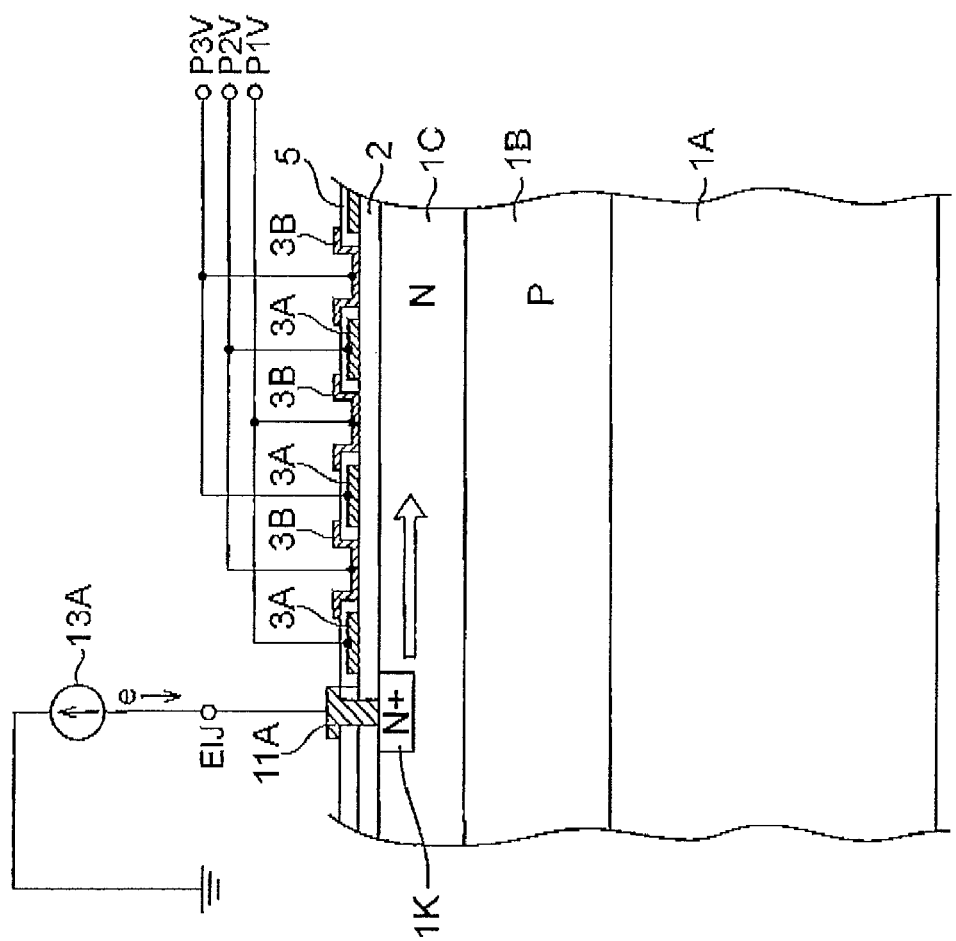
FIG. 9 is a sectional view of the solid state imaging device shown in FIG. 8 along arrows IX-IX.

FIG. 8 is a perspective view of the portion of the starting side of the imaging region VR in the electron transfer direction in a solid state imaging device according to a first embodiment. FIG. 9 is a sectional view of the solid state imaging device shown in FIG. 8 along arrows IX-IX.

In the first embodiment, the electron injecting unit is formed from the input electrode 11A that is electrically connected to the semiconductor region (semiconductor substrate) 1C. The input electrode 11A is connected to a high density N-type contact region 1K provided in the semiconductor region 1C via a connection hole provided in the insulation layer 2 (see FIG. 9). Because the contact region 1K is adjacent to the vertical transfer electrode 3A, the electrons injected into the contact region 1K via the input electrode 11A are transferred along the direction of an arrow (vertical direction) in the figure. Furthermore, as described above, because the regions R1, R2, R3, and R4 shown in FIG. 8 are blocked from the light, there is no mixing of the electric charge generated by incidence of light with the electrons injected from the electrode 11A for monitoring.

Figure 10:
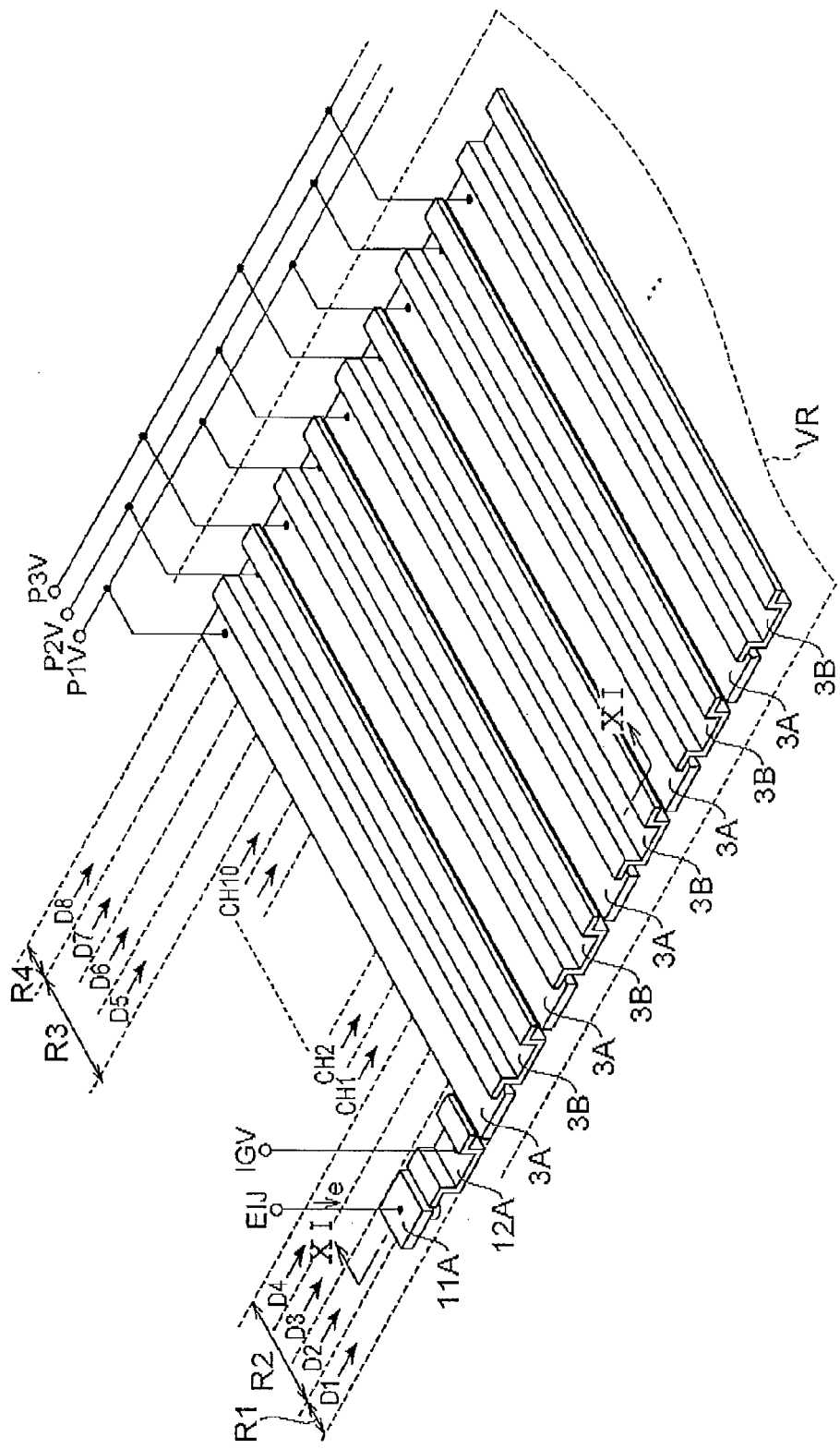
FIG. 10 is a perspective view of a portion of a starting side of an imaging region VR in an electron transfer direction in a solid state imaging device according to a second embodiment.
Figure 11:
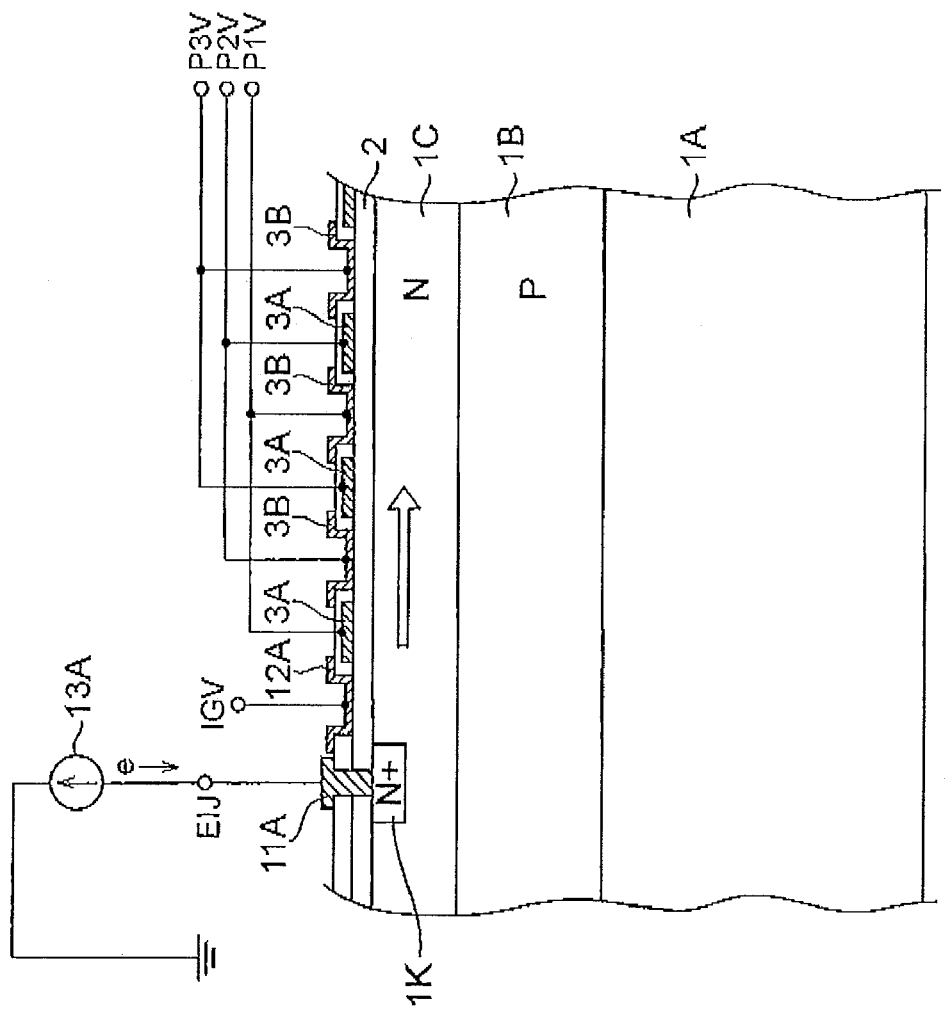
FIG. 11 is a sectional view of the solid state imaging device shown in FIG. 10 along arrows XI-XI.

FIG. 10 is a perspective view of the portion of the starting side of the imaging region VR in the electron transfer direction in a solid state imaging device according to a second embodiment. FIG. 11 is a sectional view of the solid state imaging device shown in FIG. 10 along arrows XI-XI.

This solid state imaging device is characterized in that it includes a gate electrode 12A disposed between the N-type contact region 1K according to the first embodiment and a region right below the transfer electrode 3A at the end portion of the starting side. The gate electrode 12A controls the potential between the input electrode 11A and the specific vertical shift register (transfer electrode 3A of the channel D1), and forms an electron supplying unit. The other structure is similar to that of the first embodiment.

Because the timing of injection of the electrons into the vertical shift register can be controlled by adjusting a voltage IGV applied to the gate electrode 12A, the electrons can be injected at a correct timing. Consequently, a stable monitoring of the multiplication factor can be performed. The gate electrode 12A is formed on the insulation layer 2.

Figure 12:
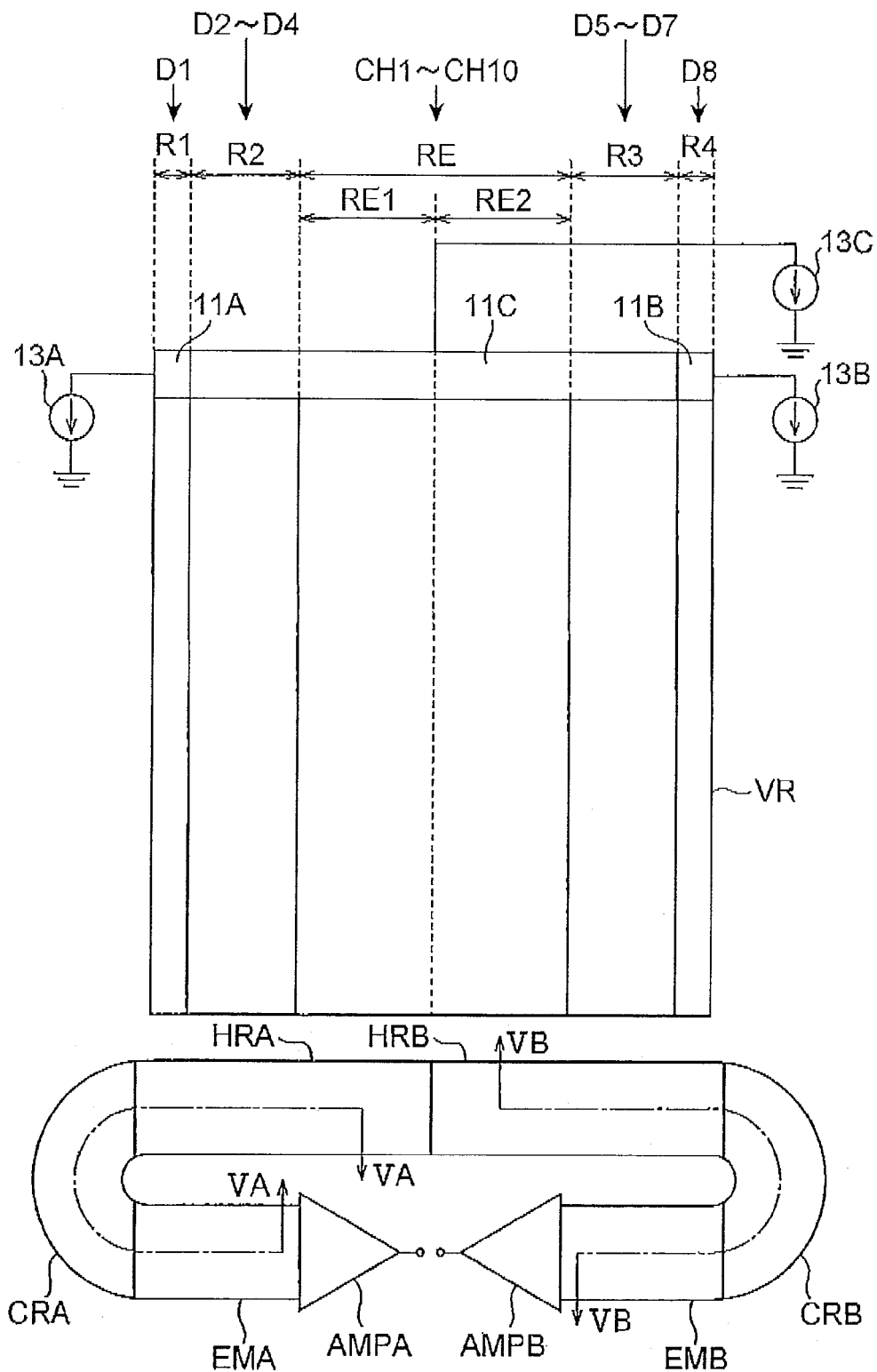
FIG. 12 is a plan view of a solid state imaging device according to a third embodiment.

FIG. 12 is a plan view of a solid state imaging device according to a third embodiment.

The multiplication register EM includes a first multiplication register EMA that multiplies the electrons transferred from a first region (R1, R2, and RE1) of the imaging region VR, and a second multiplication register EMB that multiplies the electrons transferred from a second region (R3, R4, and RE2) of the imaging region VR. In other words, the imaging region VR includes the first region that lies to the left of center in a width direction, and the second region that lies to the right of center in the width direction.

The electrons transferred from the first region on the left are transferred to the first multiplication register EMA via a first horizontal shift register HRA and a first corner register CRA. The electrons are multiplied by the first multiplication register EMA and the multiplied electrons are output to the outside via a floating diffusion amplifier AMPA. A sectional view along arrows VA-VA covering the parts from the horizontal shift register BRA to the multiplication register EMA, and an operation thereof are similar to those shown in FIG. 5. Moreover, the reference symbols HR, CR, EM, and AMP of FIG. 5 have been replaced with HRA CRA, EMA, and AMPA, respectively, in this sectional view.

The electrons transferred from the second region on the right are transferred to the second multiplication register EMB via a second horizontal shift register CRB, and a second corner register CRB. The electrons are multiplied by the second multiplication register EMB and the multiplied electrons are output to the outside via a second floating diffusion amplifier AMER A sectional view along arrows VB-VB covering the parts from the horizontal shift register HRB to the multiplication register EMB, and an operation thereof are similar to those shown in FIG. 5. Moreover, the reference symbols HR, CR, EM, and AMP of FIG. 5 have been replaced with HRB, CRB, EMB, and AMPB, respectively, in this sectional view.

A first electron injecting unit (first input electrode) 11A is disposed at the end portion of the starting side of the region R1 of the first region (R1, R2, and RE1) in the electron transfer direction, and a second electron injecting unit (second input electrode) 11B is disposed at the end portion of the starting side of the region R4 of the second region (R3, R4, and RE2) in the electron transfer direction. A third input electrode 11C is provided at the end portion of the starting side of the imaging region VR of the remaining region (R2, RE, and R3) in the electron transfer direction. Current sources 13A, 13B, and 13C are connected to the input electrodes 11A, 11B, and 11C, respectively, and supply the electrons to these electrodes. The electrons are supplied as per the requirement. The input electrodes 11A and 11B that are disposed at the ends are used for injecting electrons for monitoring the multiplication factor of the multiplication register, whereas the input electrode 11C disposed at the center can be used for injecting the electrons in other regions and monitoring.

In this manner, the electric charges generated in the first region and the second region are multiplied by different multiplication registers before being read out. Consequently, the signal can be read out in a shorter time. The multiplication factors of the multiplication registers EMA and EMB can be monitored by causing the multiplication registers EMA and EMB to multiply the electrons injected from the respective electron input units (electrodes 12A and 12B) disposed in the respective regions. In a structure that allows signal to be readout in a shorter time, the free space near the multiplication register tends to be narrower, posing a physical constraint on placement of the other elements. However, in the present embodiment, the electrons are injected not near the multiplication registers EMA, and EMB, but from an end portion of the imaging region VR. Consequently, there are no physical constraints on placement of the electron injecting units.

Figure 13:
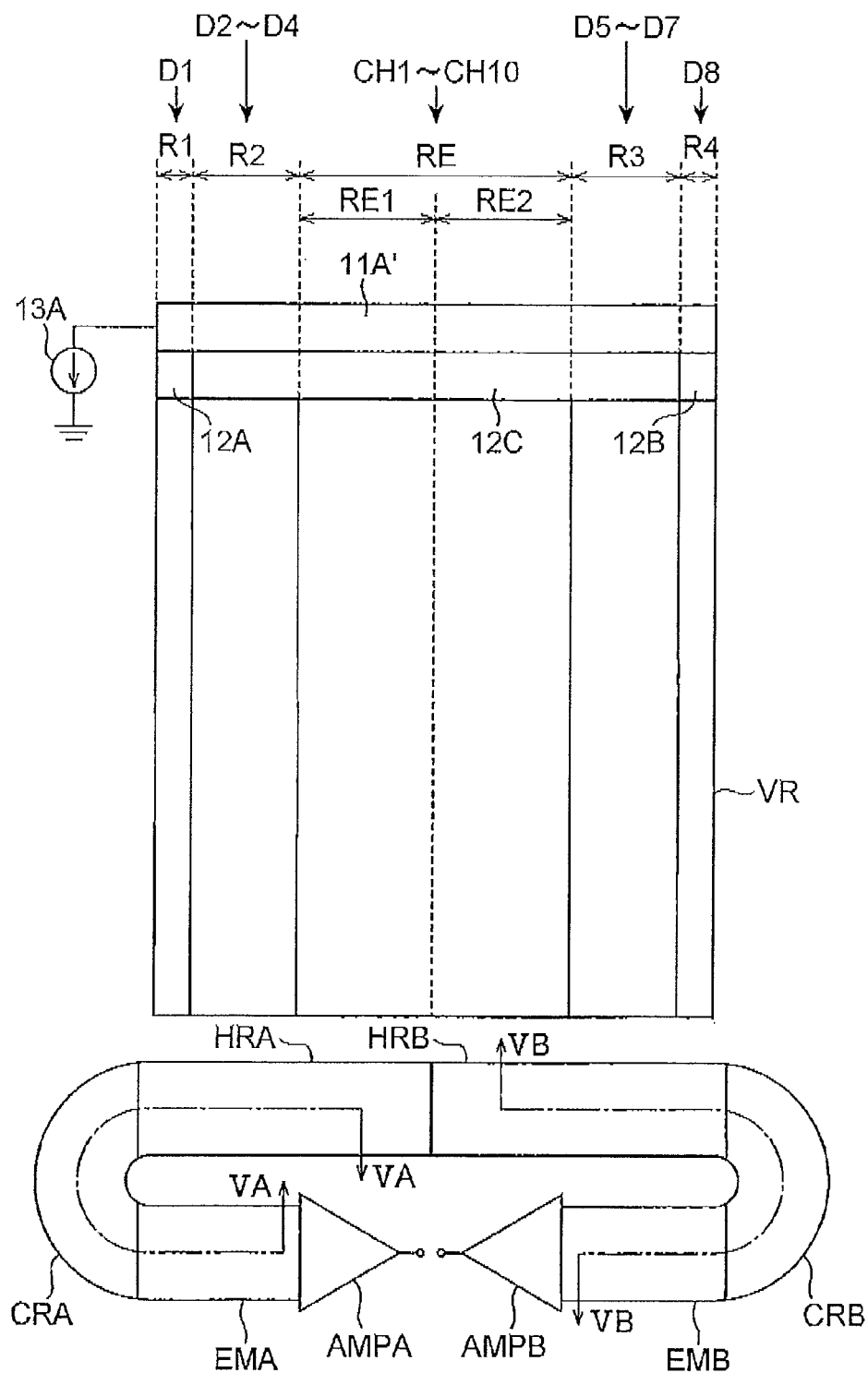
FIG. 13 is a plan view of a solid state imaging device according to a fourth embodiment.

FIG. 13 is a plan view of a solid state imaging device according to a fourth embodiment.

In the solid state imaging device according to the present embodiment, a single input electrode 11A' that extends across the regions R1, R2, RE, R3, and R4 is provided. Moreover, the gate electrode 12A is provided in the region R1, a gate electrode 12B is provided in the region R4, and a gate electrode 12C is provided in the regions R2, R3, and E3. A structure near each of the electrodes in vertical is similar to that shown in FIG. 11. The electrons are supplied as per the requirement. The gate electrodes 12A and 12B that are disposed at the ends are used for injecting electrons for monitoring the multiplication factor of the multiplication register. An amount of supplied electrons can be controlled by supplying the electrons to the input electrode 11A' from the current source 13A and controlling the voltage applied on the gate electrodes 12A and 12B. The gate electrode 12C disposed at the center can be used for injecting the electrons in other regions and monitoring. The amount of supplied electrons can be controlled by supplying the electrons to the input electrode 11A' from the current source 13A, and controlling the voltage applied on the gate electrode 12C.

Figure 14:
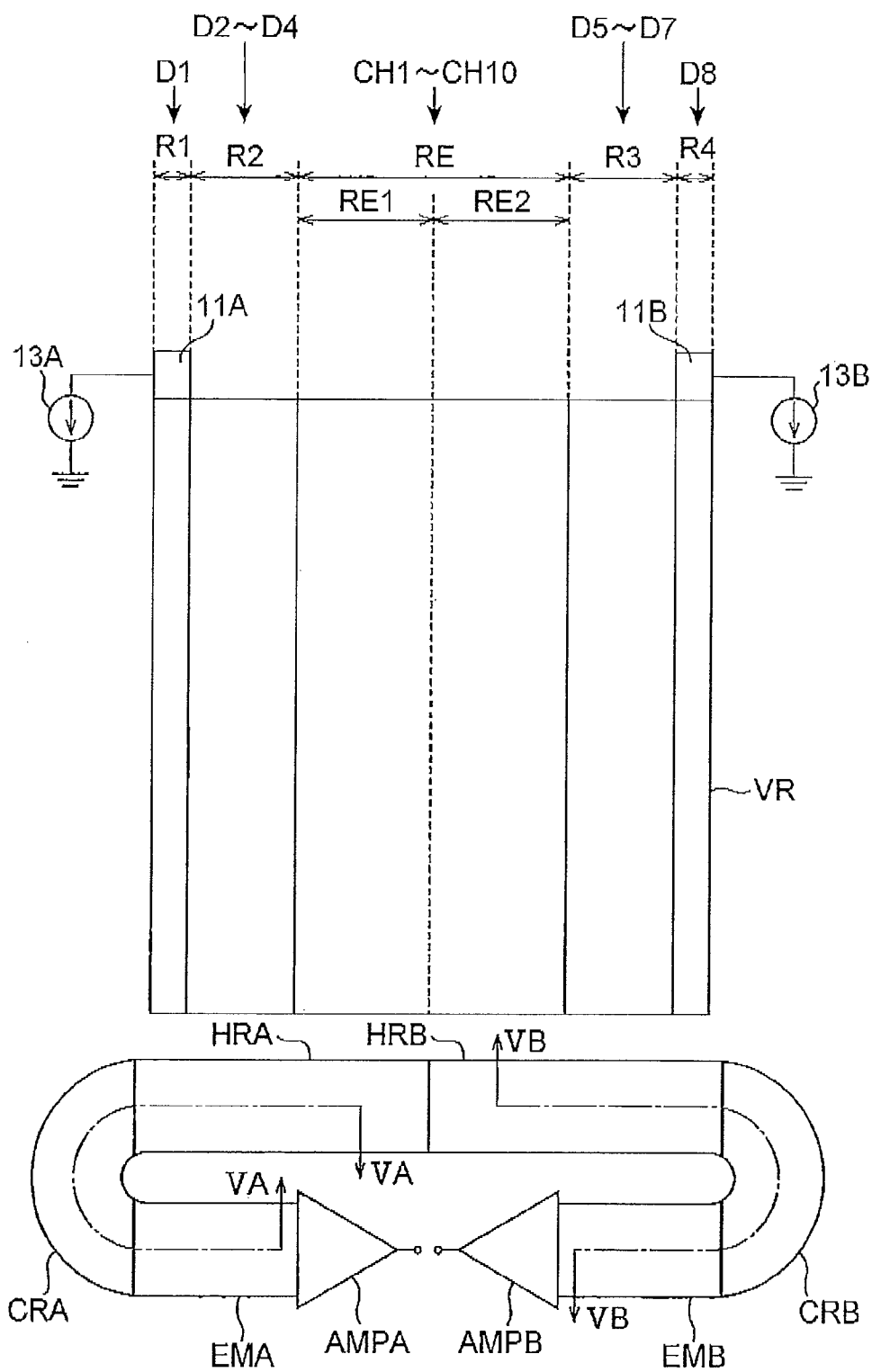
FIG. 14 is a plan view of a solid state imaging device according to a fifth embodiment.

FIG. 14 is a plan view of a solid state imaging device according to a fifth embodiment.

The solid state imaging device according to this embodiment is devoid of the input electrode 11C of the solid state imaging device according to the third embodiment shown in FIG. 12. The other structure and operation are similar to that according the third embodiment.

Figure 15:
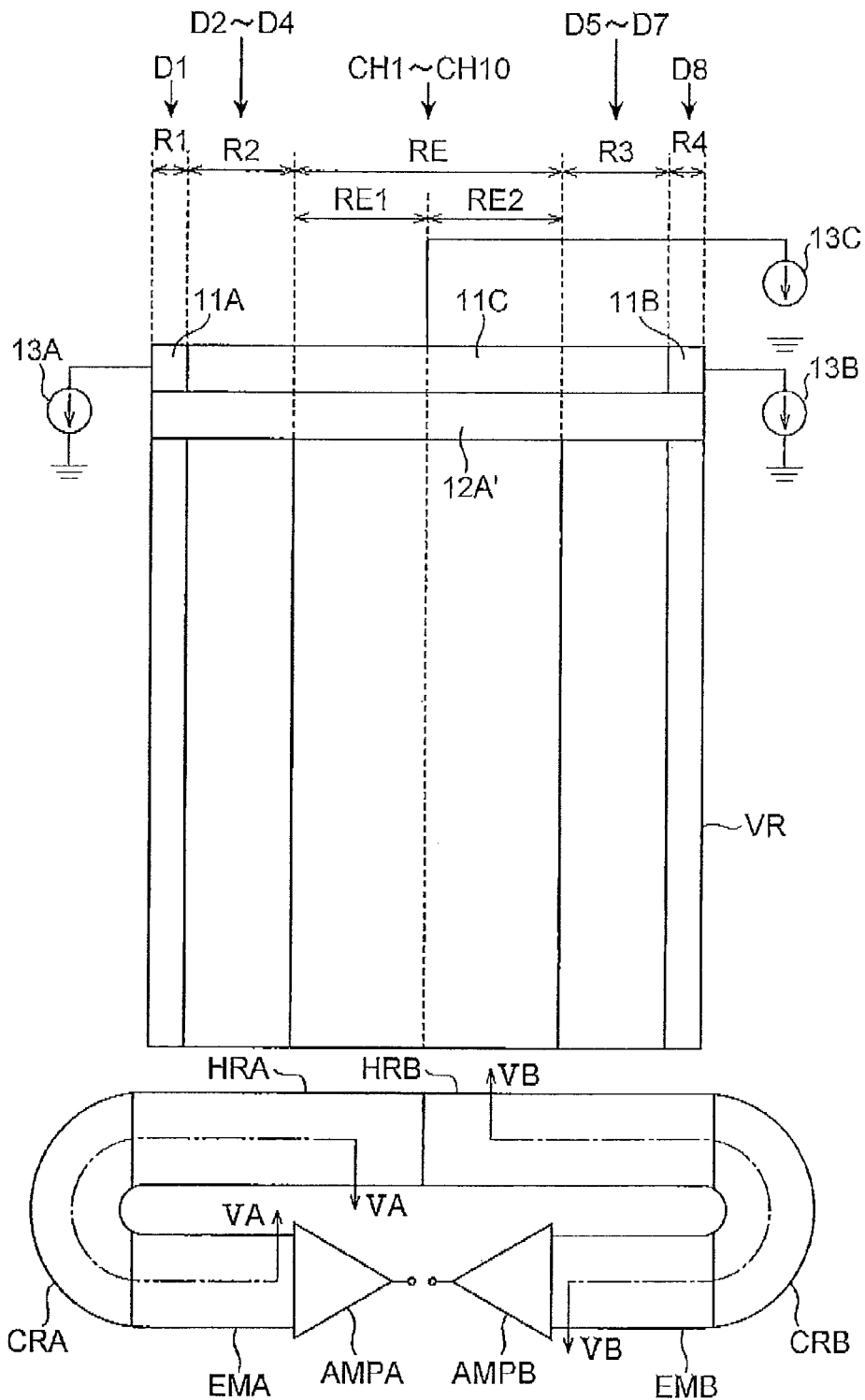
FIG. 15 is a plan view of a solid state imaging device according to a sixth embodiment.

FIG. 15 is a plan view of a solid state imaging device according to a sixth embodiment.

The solid state imaging device according to this embodiment is different from the solid state imaging device according to the third embodiment shown in FIG. 12 in the following point. That is, the gate electrode 12A' is provided in such a manner that it extends across the regions R1 to R4, between the input electrodes 11A, 11B, and 11C, and the transfer electrode at the end portion of the starting side of the vertical shift register. The other structure and operation are similar to that according the third embodiment. A vertical section along the electron transfer direction near each of the electrodes is similar to that shown in FIG. 11, except that the gate electrode 12A in FIG. 11 is replaced with the gate electrode 12A', and the input electrode 11A is replaced with the input electrodes 11A, 11B, and 11C. By controlling the voltage applied on the gate electrode 12A', an injection amount of the electrons, supplied from the current sources 13A, 13B, and 13C to the input electrodes 11A, 11B, and 11C, respectively, into the corresponding vertical shift register can be controlled.

Figure 16:
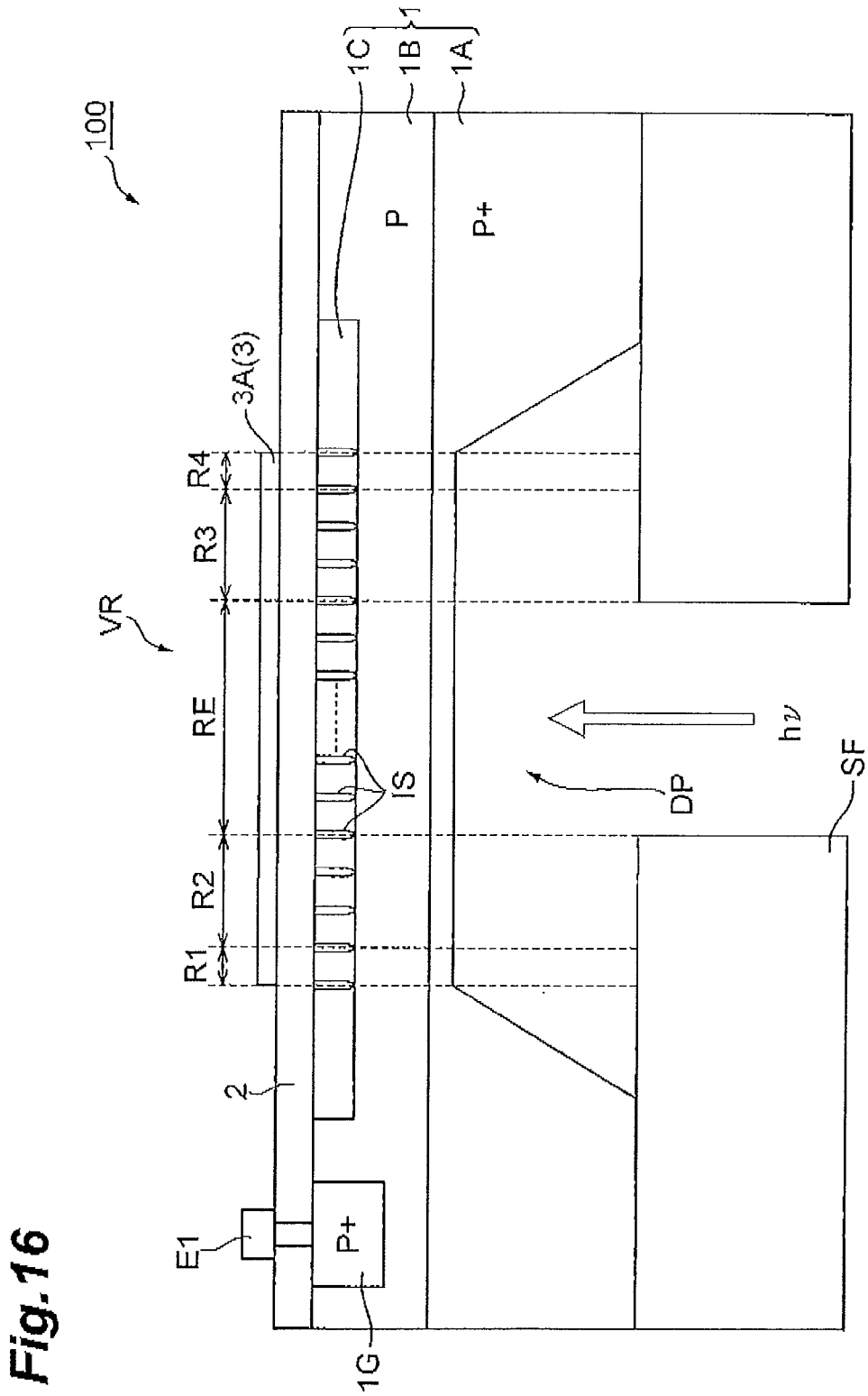
FIG. 16 is a sectional view of a solid state imaging device with a modified light blocking structure.

FIG. 16 is a sectional view of a solid state imaging device with a modified light blocking structure.

In the embodiments described above, penetration of light into the regions R1, R2, R3, and R4 was prevented by making the substrate thicker. In this embodiment, a light-blocking member SF such as an aluminium film or a ceramic film is provided on the back surface (exposure surface of the thick part) of the semiconductor substrate 1 to prevent the penetration of the light hv into the regions R1, R2, R3, and R4 from the back surface. Therefore, monitoring of the multiplication factor can be performed with high precision.

Figure 17:
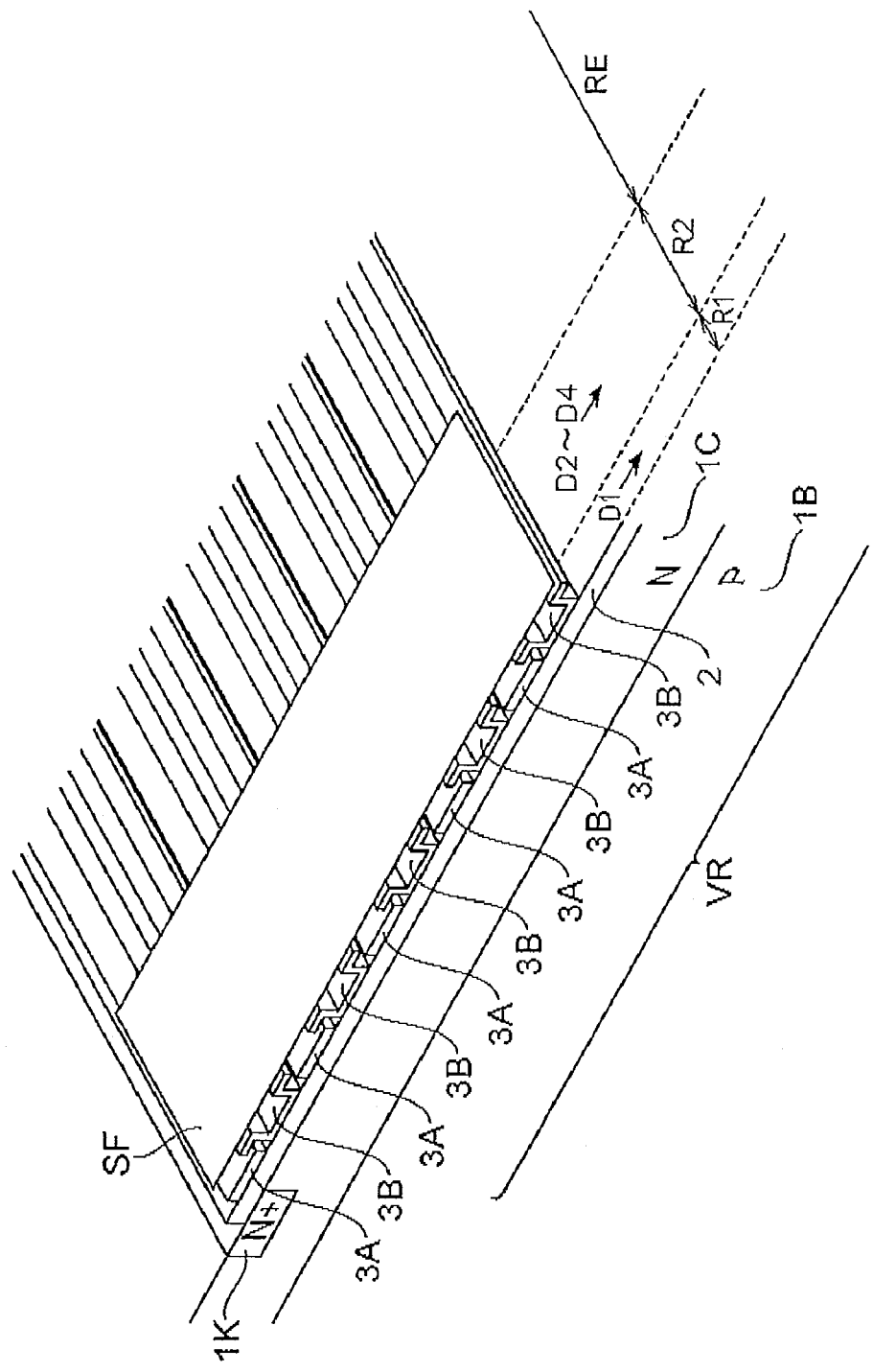
FIG. 17 is a perspective view of a portion of a starting side of an imaging region VR in an electron transfer direction in a front-surface illuminated solid state imaging device.

FIG. 17 is a perspective view of the portion of the starting side of the imaging region VR in the electron transfer direction in a front-surface illuminated solid state imaging device. In FIG. 17, electrodes for electron injection, etc. have been omitted.

In the embodiment of the type having no gate electrodes (first embodiment) described above, if the solid state imaging device is taken to be a front-surface illuminated solid state imaging device with an absent recessed portion DP, the light-blocking film SF made of aluminium is placed on the transfer electrodes 3A and 3B in the regions R1 and R2 that have formed thereon the monitoring channel D1 and the dummy channels D2 to D4. The light-blocking film SF is insulated from the transfer electrodes 3A and 3B. In such a structure, the light incident from the front surface is blocked by the light-blocking film SF, and is prevented from penetrating the monitoring channel D1 and the dummy channels D2 to D4. Therefore, monitoring of the multiplication factor can be performed with high precision.

Figure 18:
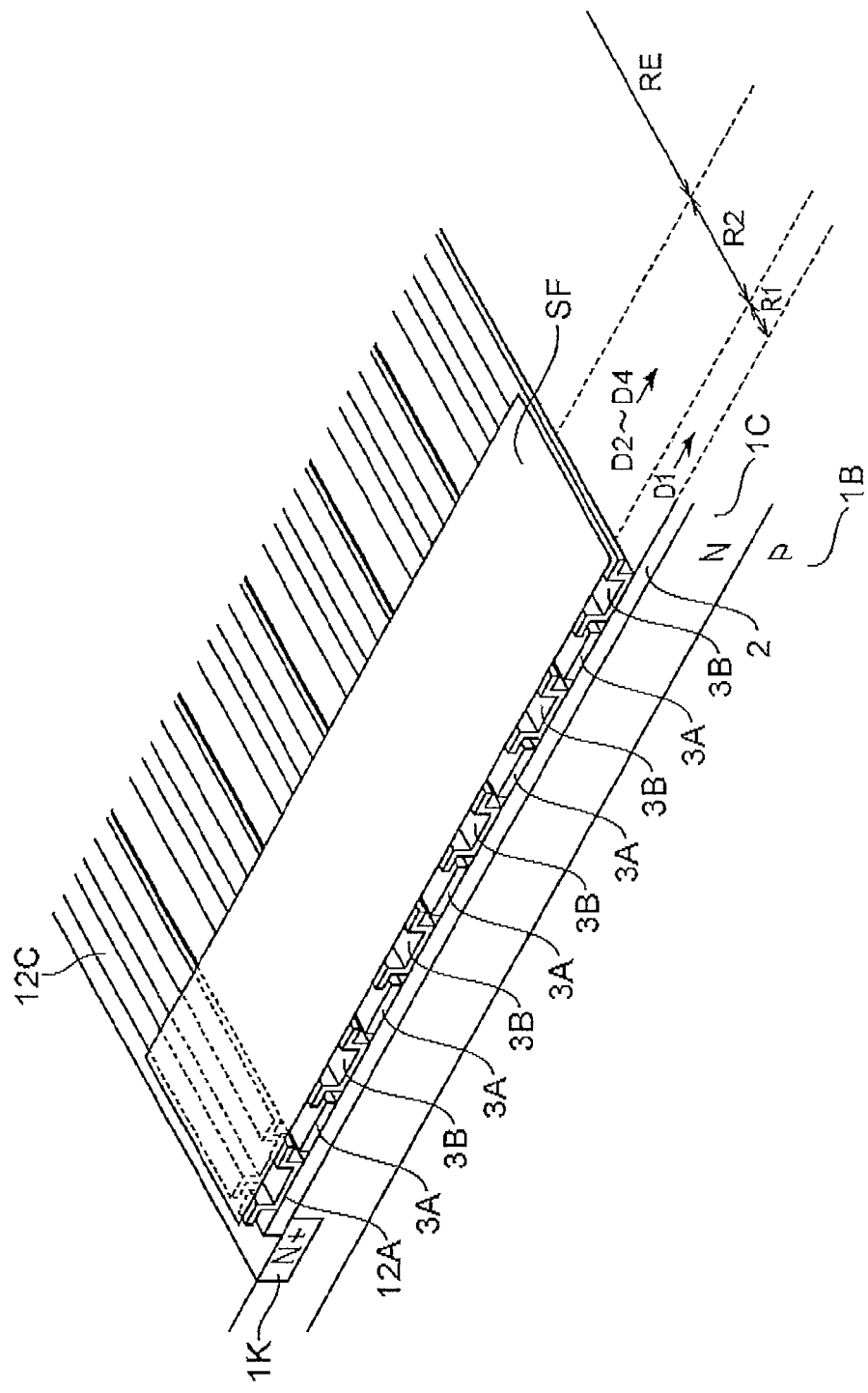
FIG. 18 is a perspective view of a portion of a starting side of an imaging region YR in an electron transfer direction in a front-surface illuminated solid state imaging device.

FIG. 18 is a perspective view of the portion of the starting side of the imaging region VR in the electron transfer direction in the front-surface illuminated solid state imaging device. In the embodiment of the type having the gate electrode 12A described above (example: fourth embodiment), if the solid state imaging device is the front-surface illuminated solid state imaging element with no recessed portion DP, the light-blocking film SF made of aluminium, and the like, is placed on the gate electrode and the transfer electrodes 3A and 3B in the regions R1 and R2 that have formed thereon the monitoring channel D1 and the dummy channels D2 to D4. The light-blocking film SF is insulated from the transfer electrodes 3A and 3B. In such a structure, the light incident from the front surface is blocked by the light-blocking film SF, and is prevented from penetrating the monitoring channel D1 and the dummy channels D2 to D4. Therefore, monitoring of the multiplication factor can be performed with high precision.

Thus, because electrons can be injected line by line (channel by channel), multiplication factor can be monitored line by line in realtime with a simple structure.

Because of the presence of the N-type semiconductor region 1C, an embedded channel-type CCD has been configured. If the N-type semiconductor region 1C is omitted, a surface channel-type CCD can be configured. The embodiments described above can be equally applied to the front-surface illuminated solid state imaging device, in which no etching of the semiconductor substrate is required.

INDUSTRIAL APPLICABILITY

The present invention is applicable to the solid state imaging device with the electron multiplying function that enables imaging of a very weak optical image by performing electron multiplication with high-performance.

The above embodiment can be applied, without etching the semiconductor substrate, to a front-surface illuminated solid state imaging device.

REFERENCE SIGNS LIST

1A . . . Semiconductor substrate, 1B . . . Epitaxial layer, VR . . . Imaging region, 1C . . . N-type semiconductor region, HR . . . Horizontal shift register, EM . . . Multiplication register, 11A . . . Input electrode, 12A . . . Gate electrode.

The invention claimed is:

1. A solid state imaging device with an electron multiplying function comprising:
an imaging region formed of a plurality of vertical shift registers, wherein the imaging region has a plurality of vertical electric charge transfer electrodes formed on a semiconductor substrate, and wherein an insulation layer is arranged between the transfer electrodes and the semiconductor substrate;
a horizontal shift register that transfers electrons from the imaging region;
a multiplication register that multiplies the electrons from the horizontal shift register; and an electron injecting unit provided at an end portion of a starting side of the imaging region in an electron transfer direction of the vertical shift registers, the electron injecting unit being electrically connected with the semiconductor substrate, wherein a specific vertical shift register into which the electrons are injected by the electron injecting unit is set in such a way as to be blocked from incident light.

2. The solid state imaging device with the electron multiplying function according to claim 1, wherein the semiconductor substrate has a thin part surrounded by a thick part, wherein the imaging region is formed in the thin part, and wherein the specific vertical shift register is disposed in the thick part.

3. The solid state imaging device with the electron multiplying function according to claim 2, wherein the electron injecting unit includes an input electrode that is electrically connected to the semiconductor substrate; and a gate electrode that controls a potential between the input electrode and the specific vertical shift register.

4. The solid state imaging device with the electron multiplying function according to any one of claims 1 to 3, wherein the multiplication register includes a first multiplication register that multiplies the electrons transferred from a first region of the imaging region; and a second multiplication register that multiplies the electrons transferred from a second region of the imaging region, and the electron injecting unit includes a first electron injecting unit provided at an end portion of a starting side of the first region in the electron transfer direction of the vertical shift registers; and a second electron injecting unit provided at an end portion of a starting side of the second region in the electron transfer direction of the vertical shift registers.

* * * * *